United States Patent
Farchi et al.

(10) Patent No.: US 8,954,310 B2
(45) Date of Patent: Feb. 10, 2015

(54) AUTOMATIC DESIGNATION OF EQUIVALENT VARIABLE VALUES

(75) Inventors: Eitan Farchi, Pardes Hana (IL); Itai Segall, Tel-Aviv (IL); Rachel Tzoref-Brill, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 13/285,018

(22) Filed: Oct. 31, 2011

(65) Prior Publication Data

US 2013/0110489 A1 May 2, 2013

(51) Int. Cl.
   *G06F 9/44* (2006.01)
   *G01R 31/3183* (2006.01)

(52) U.S. Cl.
   CPC .................. *G01R 31/31835* (2013.01)
   USPC .......................................................... 703/21

(58) Field of Classification Search
   CPC ......... G06F 17/00; G06F 11/263; G06F 9/44;
        G06F 11/3684; G06F 8/30; G06F 17/50;
        G06F 17/504; G06F 11/3608; G01R 31/31807
   USPC ................................................ 703/21, 22, 23
   See application file for complete search history.

(56) References Cited

U.S. PATENT DOCUMENTS

| | | | |
|---|---|---|---|
| 6,577,982 B1 | 6/2003 | Erb | |
| 7,024,589 B2 | 4/2006 | Hartman et al. | |
| 7,032,212 B2 * | 4/2006 | Amir et al. | 717/124 |
| 7,324,931 B1 * | 1/2008 | Warlock | 703/13 |
| 8,448,146 B2 * | 5/2013 | Pasala et al. | 717/126 |
| 2004/0255275 A1 | 12/2004 | Czerwonka | |
| 2007/0234314 A1 * | 10/2007 | Godwin et al. | 717/136 |
| 2008/0255822 A1 * | 10/2008 | Adir et al. | 703/21 |
| 2010/0275062 A1 | 10/2010 | Ur | |
| 2010/0287534 A1 | 11/2010 | Vangala et al. | |
| 2012/0324286 A1 * | 12/2012 | Birnbaum et al. | 714/26 |

OTHER PUBLICATIONS

Adir et al. ("A Generic Micro-Architectural Test Plan Approach for Microprocessor Verification", ACM 2005, pp. 769-774).*
Benjamin et al. ("A Study in Coverage-Driven Test Generation" , ACM 1999, pp. 1-6).*
Thomas Reinbacher ("Introduction to Embedded Software Verifcation" Master Embedded Systems System Architecture and Engineering SS-2008, pp. 1-11).*
Grindal et al., "Combination testing strategies: a survey", Softw. Test, Verif. Reliab 15(3),pp. 167-199, 2005.
Cichos et al., "Efficient Test Suite Reduction by Merging Pairs of Suitable Test Cases", Lecture Notes in Computer Science, vol. 6627/2011,pp. 244-258, 2011.

(Continued)

*Primary Examiner* — Omar Fernandez Rivas
*Assistant Examiner* — Iftekhar Khan
(74) *Attorney, Agent, or Firm* — Daniel Simek; Suzanne Erez; Eyal Gilboa

(57) ABSTRACT

A method for modeling a test space comprising defining a coverage model including: one or more variables, wherein respective values for the variables are assigned, and restrictions based on which valid variable value combinations are determined for the purpose of testing the model, wherein at least two values that are assignable to the one or more variables are merged to reduce number of variable values in the coverage model.

20 Claims, 4 Drawing Sheets

Coverage Model 110 a = {a1, a2, a3}
b = {b1, b2, b3}
c = {c1, c2, c3}
d = {d1, d2, d3}

Computing System 100

(56) References Cited

OTHER PUBLICATIONS

Bouquet et al., "Test Generation Based on Abstraction and Test Purposes to Complement Structural Tests", in A-MOST'10, 6th int. Workshop on Advances in Model Based Testing, IEEE proceedings of ICST'2010, Paris, France, Feb. 2011.

Adler et al., "Evaluating workloads using comparative functional coverage", International Journal on Software Tools for Technology Transfer (STTT), vol. 13, No. 3, pp. 207-221, DOI: 10.10071s10009-010-0165-7; HVC 2008.

Calvagna et al., "A Logic-based Approach to Combinatorial Testing with Constraints", Lecture Notes in Computer Science, vol. 4966/2008, pp. 66-83, DOI:10.1007/978-3-540-79124-9_6, 2008.

* cited by examiner

AUTOMATIC DESIGNATION OF EQUIVALENT VARIABLE VALUES

COPYRIGHT & TRADEMARK NOTICES

A portion of the disclosure of this document may contain material subject to copyright protection. Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

TECHNICAL FIELD

The disclosed subject matter relates generally to testing system behavior in a computing environment.

BACKGROUND

Model based techniques may be used for generating tests for verifying the behavior of a computing system. A model includes a set of attributes in addition to values for the attributes and corresponding restrictions on said values or value combinations. The set of valid value combinations defines the space to be tested. In a Cartesian-product based model, the test space is defined as all possible combinations of variable values that are not ruled out by restrictions.

The size of a Cartesian-product based model is the product of the number of values for each attribute (i.e., $A_1 * A_2 * \ldots * A_n$), where $A_n$ represents the number of valid values for the $n^{th}$ attribute. Depending on the number of attributes in the model, the possible number of values assigned to each attribute and the nature of the restrictions, the size of the model can become prohibitively large, making coverage analysis difficult, inefficient and possibly ineffective.

SUMMARY

For purposes of summarizing, certain aspects, advantages, and novel features have been described herein. It is to be understood that not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In accordance with one embodiment, a method for modeling a test space is provided. The method comprises defining a coverage model including: one or more variables, wherein respective values for the variables are assigned, and restrictions based on which valid variable value combinations are determined for the purpose of testing the model, wherein at least two values that are assignable to the one or more variables are merged to reduce number of variable values in the coverage model.

In accordance with one or more embodiments, a system comprising one or more logic units is provided. The one or more logic units are configured to perform the functions and operations associated with the above-disclosed methods. In yet another embodiment, a computer program product comprising a computer readable storage medium having a computer readable program is provided. The computer readable program when executed on a computer causes the computer to perform the functions and operations associated with the above-disclosed methods.

One or more of the above-disclosed embodiments in addition to certain alternatives are provided in further detail below with reference to the attached figures. The disclosed subject matter is not, however, limited to any particular embodiment disclosed.

BRIEF DESCRIPTION OF THE DRAWINGS

The disclosed embodiments may be better understood by referring to the figures in the attached drawings, as provided below.

Features, elements, and aspects that are referenced by the same numerals in different figures represent the same, equivalent, or similar features, elements, or aspects, in accordance with one or more embodiments.

DETAILED DESCRIPTION OF EXAMPLE EMBODIMENTS

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

Figure 1:
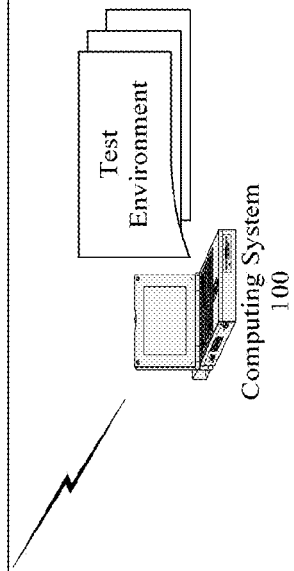
FIG. 1 illustrates an exemplary environment in accordance with one or more embodiments, wherein a coverage model is used to test a target system.

Referring to FIG. 1, in one or more embodiments, a coverage model 110 may be used to test a computing system 100. The model may define variables (i.e., attributes) a, b, c and d, for example, respective values for the variables (e.g., "a1, a2, a3"; "b1, b2, b3"; etc.), and conditions or restrictions (not shown) that indicate when values for one or more variables or combination of variables are valid or invalid. The set of valid value combinations and requirements for combinations of variables that are to be included in the test plan define the coverage model.

The size of the test space for the model may be defined by the product (e.g., the Cartesian product) of variable values taking into account the dictated conditions or restrictions. The size of the test space is thus approximately proportional to the product of the number of values that may be assigned to each variable. In one embodiment, to reduce the number of tests for testing the system, a subset of the variables whose combinations are to be covered may be defined by way of applying an algorithm (e.g., a combinatorial algorithm) to filter out certain variable value combinations.

As such, in one embodiment, a combinatorial algorithm is used to generate a relatively small set of tests that satisfy certain interaction requirements between selected variables. The restrictions for the combination of variable values may be provided as input to a combinatorial test design (CTD) engine. Given a Cartesian-product model with n variables, the combinatorial algorithm finds a subset of valid variable value combinations in the test space that covers possible combinations of every m variables, wherein m defines a certain interaction level.

The interaction level, depending on implementation, refers to the coverage of the selected subset of the test space, wherein the test space covers the possible combinations of m number of variables in the set defined by the respective coverage model—m is less than or equal to the total number of variables n in the model. As an example, interaction level two means that for every two variables all or some valid value combinations appear in the selected subset of the test space. Empirical evidence shows that most bugs may be found when testing the interesting interactions among a relatively small number of variables.

In one embodiment, further testing efficiency may be achieved by reducing the number of values assigned to a variable at the modeling stage. For example, several values associated with a variable, or several values associated with different variables may be merged into a single value. In this manner, a smaller model is constructed that may be used to abstract one or more aspects of the original larger model. The abstraction process may be automated by analyzing a model to determine whether there are any variable values that may be merged together to achieve the abstraction.

Figure 2:
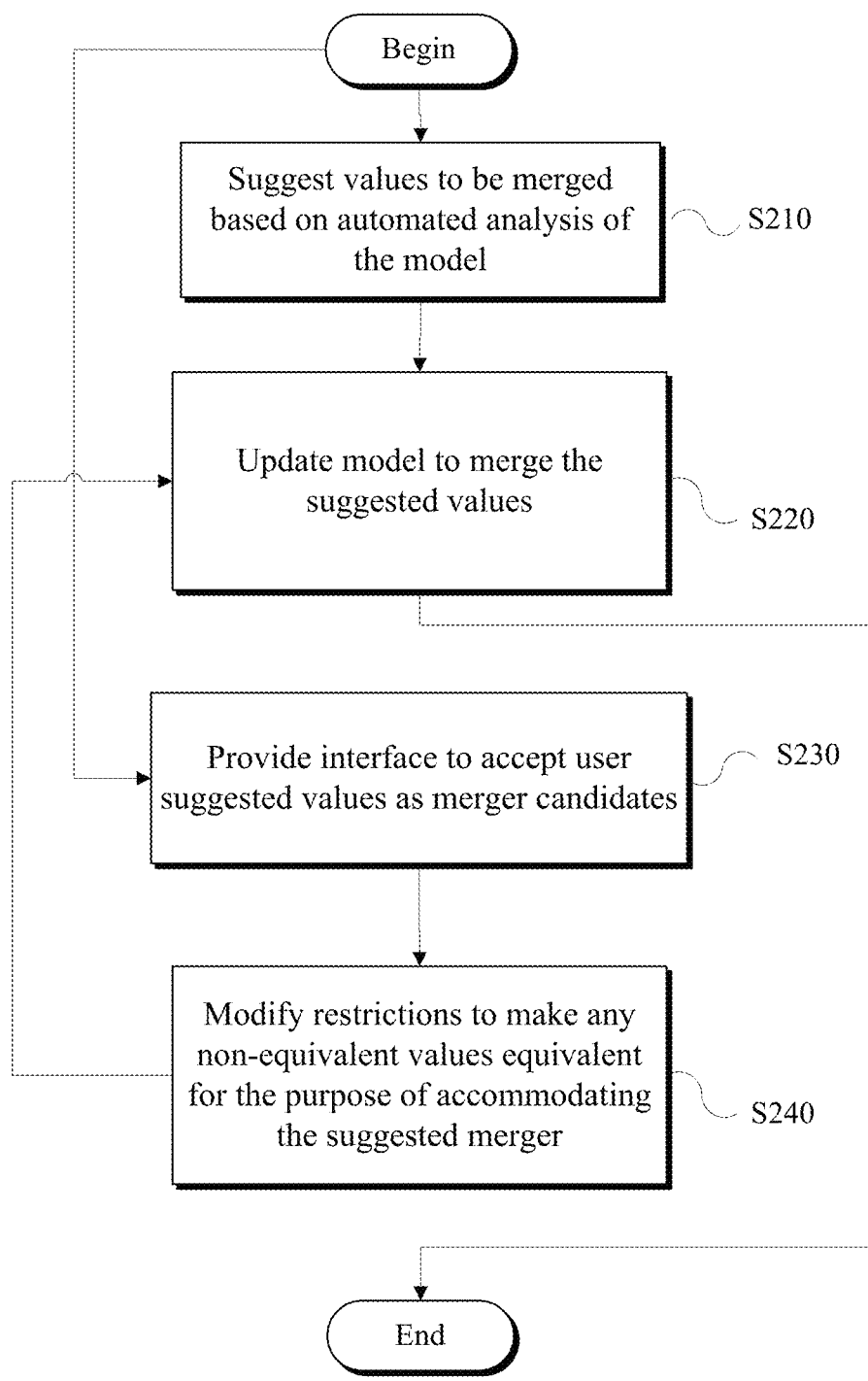
FIG. 2 is a flow diagram of an exemplary method for modeling a test space for a system, wherein one or more values for a variable are merged, in accordance with one embodiment.

Referring to FIG. 2, a merger tool, scheme or mechanism (e.g., a software application) may be configured to analyze a set of values for one or more variables in the model in light of the designated restrictions and suggest the merger of at least two values for a variable, where the two values are deemed equivalent or interchangeable in the context of a test plan for the model (S210). As provided in further detail below, if the suggestion is accepted, then the model is updated so that the suggested values are merged, i.e., considered as a single value for the purpose of testing (S220).

In accordance with one optional aspect, if variable values are not found that are suitable for merger or if input from an independent entity (e.g., a human operator or otherwise intelligent system) is needed in order to help designated values that are mergeable, then an interface may be provided to accept input that designates candidate variable values that are to be merged (S230). If it is determined that the candidate values are not equivalent within the context of the applicable restrictions in the model, then further input may be needed to modify the restrictions to make any non-equivalent candidate values equivalent for the purpose of accommodating the merger (S240). Once the restrictions are modified, then the model may be updated to merge the suggested values (S220).

To automatically identify the values that are merger candidates, the merger tool may be a functional modeling abstractor used to determine if two or more values are equivalent. In one embodiment, two values are deemed equivalent, if for all possible test combinations in the model the validity of each combination remains the same regardless of which one of the merged values is assigned to the variable for that test. In other words, a first value "a1" and a second value "a2" for a variable "a" are deemed equivalent if a row in the Cartesian product in which value "a1" is used is valid, if and only if, the same row in which value "a2" is used is valid. The above definition may be extended to cover tuples of values for more than one variable.

As an example, consider a model in which variable "a" is a variable that may be assigned values $\{1, 2, 3\}$ and where b and c are Boolean variables where each may be assigned a value of true or false (e.g., $\{T, F\}$) with the restriction that when "a" is equal to 1 or 2, then value of "b" must be different from value of "c", and when "a" is equal to 3, then only the case where both values for "b" and "c" are false is excluded. In other words:

1. not allowed (a==1 && b==c)
2. not allowed (a==2 && ((b==true && c==true)||(b==false && c==false)))
3. not allowed (a==3 && b==true && c==true)

In the above example, for variable "a" values 1 and 2 are equivalent because any valid test in which the value of "a" is equal to 1 is also valid, if 1 is substituted with 2 (note that there are two such tests: [a=1, b=T, c=F]; and [a=1, b=F, c=T]). Further, if value of "a" is switched from 1 to 2, the invalid tests remain invalid. Similarly, for tests in the reverse direction, if the value of "a" is switched from 2 to 1, the valid tests remain valid and the invalid tests remain invalid. It is noted, however, that value 3 for variable "a" is not equivalent to 1 and 2, since there is at least one test that is valid when "a" is set to 3 (e.g., [a=3, b=F, c=F] is a legal value combination), but when the value of "a" is set to 1 or 2 that same test is invalid (e.g., [a=1, b=F, c=F] and [a=2, b=F, c=F] are illegal value combinations).

In one implementation, an efficient symbolic representation of value combinations may be implemented using a binary decision diagram (BDD), for example. In this exemplary embodiment, a data structure is used for representing symbolic sets that define one or more elements based on their characteristics rather than listing the members of the set. As such, the computation of equivalent values for a variable may be performed symbolically and efficiently. That is, given a variable "a" the equivalent classes for assignable values to "a" may be computed as follows:

For each value v:
  Compute the intersection of the set of all valid tests with the set of all tests in which a=v;
  Project the result on all variables other than "a" to find the set of all assignments to the variables other than "a" for which the extension with a=v is valid;
  Partition the values of "a" into equivalent classes according to the above result, such that two values are equivalent if and only if the result of the above computations is equal for both values.

The above scheme may be applicable in a scenario where two or more values that are equivalent are to be merged according to the above definition. In the above, due to the equivalence, the semantics of the merger are well defined (i.e., as noted earlier, a row in the resulting Cartesian product based model remains valid if and only if the same row in the original Cartesian product based model, in which the new value is replaced by one of the original values, was valid). It is noteworthy that due to the equivalence, it would be irrelevant which of the original values is considered or the order in which the values are included in a test.

In one embodiment, restrictions for a model may be provided by way of general logic that defines when a test is valid or invalid. A test may be transformed into a disjunctive normal form (DNF). In Boolean logic, a DNF is a standardization or normalization of a logical formula which is a disjunction of conjunctive clauses. In the context of this disclosure, a disjunction of the conjunctive clauses is where each term in the inner conjunction is a comparison of a single variable to a single value. In this form, the values that are merged are identifiable and may be replaced with abstract values, in accordance with one embodiment.

As noted earlier, in an optional aspect, two or more values that are not deemed to be equivalent may be merged. In such cases, interference by an independent entity (e.g., a human operator) may be needed to update the model's restrictions to allow for combination of variable values in the model to be correctly identified as valid, if the two non-equivalent values are merged. In other words, certain restrictions may need to be relaxed or modified if the updated model is to correctly capture the validity of tests with respect to the merged values.

In one embodiment, the restrictions that cause the values to be non-equivalent may be identified automatically by the merger tool by, for example, highlighting the conflicting restrictions. A human operator may thus focus on the areas in the model that may require manual adjustments so that the merger of values is a success. Depending on implementation, some restrictions may be automatically adjusted without human intervention, if the restrictions do not distinguish between the merged values, even where the restrictions apply to the merged values.

For example, in the example provided earlier, assume a user chooses to merge the values 1 and 2 for variable "a". The merger tool may automatically update the model to merge the two values in the variable value combinations that are to be tested. This is because values 1 and 2 are equivalent, and for the merged values the model defines when the combination of "a" with other variables is valid or invalid based on each value 1 or 2.

If, on the other hand, the user chooses to merge the values 2 and 3, the merger tool may need the user's help to relax the restrictions for the model. For example, let's refer to the merged values as "2-3", and consider the test for a combination of variables with values: [a="2-3", b=F, c=F]. Considering the unrelaxed (i.e., original) restrictions in the model, when "a" is equal to 2 or 3, one value combination is invalid (e.g., [a=2, b=F, c=F]), and the other value combination is valid (e.g., [a=3, b=F, c=F]). Thus, the merger tool may not be able to determine whether the user's intention for merging the two values was for making one or the other combination to be deemed as valid for testing purposes.

In the above scenario, user input may be needed to disambiguate the merger by for example indicating which of the combinations should be valid. In one embodiment, the merger tool may for example indicate to the user that certain restrictions may be automatically adjusted to meet the merger request, but that user input may be needed when considering specific variable value combinations in a test for the model. Alternatively, the merger tool may request user interaction to help update a specific restriction.

In one implementation, a merger of values (i.e., value abstraction) may be accomplished using a boundary values where, for example, given an integer parameter, the user may mark a specific value as a boundary value (e.g., boundary=0), thus splitting the range of assignable values to a variable into three separate sets. One set would define the values below the boundary (e.g., values<0), the other set would define the values above the boundary (e.g., values>0), and the third would define the boundary (e.g., 0).

To elaborate, consider that in the example disclosed earlier additional values 4 and 5 are introduced for "a" such that when a=4 or a=5, any value assigned to variables "b" or "c" is valid. In this scenario, the merger tool may suggest to the user that since "a" may be assigned values included in the range 1 through 5 (i.e., a={1, 2, 3, 4, 5}), the user may consider merging non-boundary values (e.g., values 2, 3, 4) so that "a" may be assigned values in the set {1, "2-3-4", 5). In this example, the boundary values are 1 and 5, with the range of assignable values being defined as [a=1, 1<a<5, a=5].

Note that in the above example neither values 2, 3 or 4 are equivalent. For that reason, if the user chooses to accept the above boundary value merger suggestion, user's intervention may be needed to relax or modify the model's restrictions or to disambiguate the intention for the merger of values. The above methods thus help ease the abstraction process for a user by first identifying what may be (e.g., can or should be) abstracted, and second by also performing the abstraction process.

The methods and implementations discussed above are disclosed by way of example in the context of test planning and combinatorial test design. It is noteworthy, however, that same or similar methods and implementations may be applied in other contexts to develop coverage models for other purposes, such as functional coverage analysis and design review, without limitation.

In different embodiments, the claimed subject matter may be implemented as a combination of both hardware and software elements, or alternatively either entirely in the form of hardware or entirely in the form of software. Further, computing systems and program software disclosed herein may comprise a controlled computing environment that may be presented in terms of hardware components or logic code executed to perform methods and processes that achieve the results contemplated herein. Said methods and processes, when performed by a general purpose computing system or machine, convert the general purpose machine to a specific purpose machine.

Figure 3A:
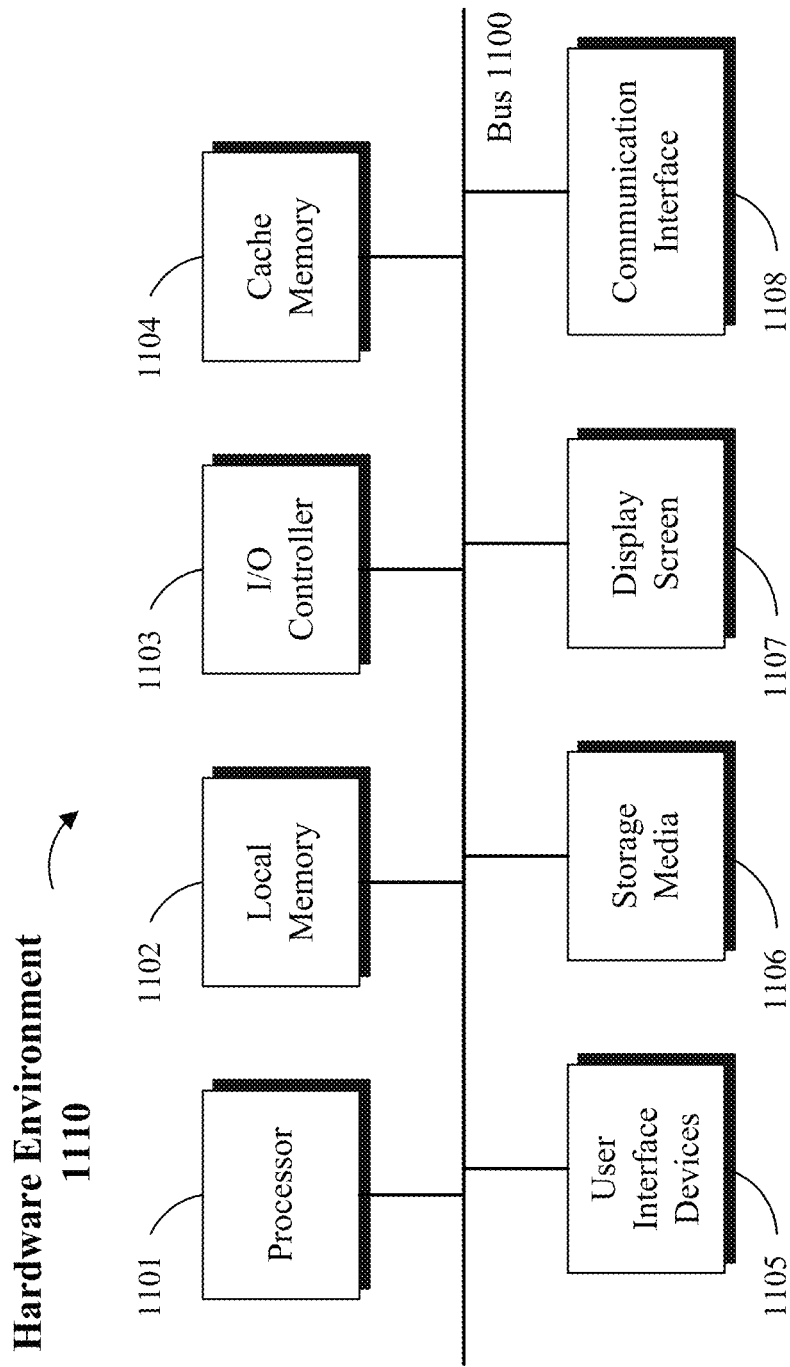
FIGS. 3A and 3B are block diagrams of hardware and software environments in which the disclosed systems and methods may operate, in accordance with one or more embodiments.
Figure 3B:
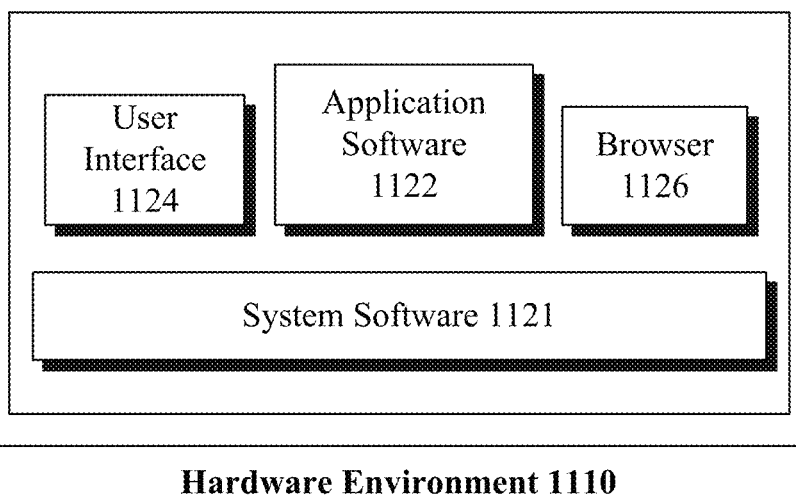

Referring to FIGS. 3A and 3B, a computing system environment in accordance with an exemplary embodiment may be composed of a hardware environment 1110 and a software environment 1120. The hardware environment 1110 may comprise logic units, circuits or other machinery and equipments that provide an execution environment for the components of software environment 1120. In turn, the software environment 1120 may provide the execution instructions, including the underlying operational settings and configurations, for the various components of hardware environment 1110.

Referring to FIG. 3A, the application software and logic code disclosed herein may be implemented in the form of computer readable code executed over one or more computing systems represented by the exemplary hardware environment 1110. As illustrated, hardware environment 110 may comprise a processor 1101 coupled to one or more storage elements by way of a system bus 1100. The storage elements, for example, may comprise local memory 1102, storage media 1106, cache memory 1104 or other computer-usable or computer readable media. Within the context of this disclosure, a computer usable or computer readable storage medium may include any recordable article that may be utilized to contain, store, communicate, propagate or transport program code.

A computer readable storage medium may be an electronic, magnetic, optical, electromagnetic, infrared, or semiconductor medium, system, apparatus or device. The computer readable storage medium may also be implemented in a propagation medium, without limitation, to the extent that such implementation is deemed statutory subject matter. Examples of a computer readable storage medium may include a semiconductor or solid-state memory, magnetic tape, a removable computer diskette, a random access memory (RAM), a read-only memory (ROM), a rigid magnetic disk, an optical disk, or a carrier wave, where appropriate. Current examples of optical disks include compact disk, read only memory (CD-ROM), compact disk read/write (CD-RAY), digital video disk (DVD), high definition video disk (HD-DVD) or Blue-Ray™ disk.

In one embodiment, processor 1101 loads executable code from storage media 1106 to local memory 1102. Cache memory 1104 optimizes processing time by providing temporary storage that helps reduce the number of times code is loaded for execution. One or more user interface devices 1105 (e.g., keyboard, pointing device, etc.) and a display screen 1107 may be coupled to the other elements in the hardware environment 1110 either directly or through an intervening I/O controller 1103, for example. A communication interface unit 1108, such as a network adapter, may be provided to enable the hardware environment 1110 to communicate with local or remotely located computing systems, printers and storage devices via intervening private or public networks (e.g., the Internet). Wired or wireless modems and Ethernet cards are a few of the exemplary types of network adapters.

It is noteworthy that hardware environment 1110, in certain implementations, may not include some or all the above components, or may comprise additional components to provide supplemental functionality or utility. Depending on the contemplated use and configuration, hardware environment 1110 may be a desktop or a laptop computer, or other computing device optionally embodied in an embedded system such as a set-top box, a personal digital assistant (PDA), a personal media player, a mobile communication unit (e.g., a wireless phone), or other similar hardware platforms that have information processing or data storage capabilities.

In some embodiments, communication interface 1108 acts as a data communication port to provide means of communication with one or more computing systems by sending and receiving digital, electrical, electromagnetic or optical signals that carry analog or digital data streams representing various types of information, including program code. The communication may be established by way of a local or a remote network, or alternatively by way of transmission over the air or other medium, including without limitation propagation over a carrier wave.

As provided here, the disclosed software elements that are executed on the illustrated hardware elements are defined according to logical or functional relationships that are exemplary in nature. It should be noted, however, that the respective methods that are implemented by way of said exemplary software elements may be also encoded in said hardware elements by way of configured and programmed processors, application specific integrated circuits (ASICs), field programmable gate arrays (FPGAs) and digital signal processors (DSPs), for example.

Referring to FIG. 3B, software environment 1120 may be generally divided into two classes comprising system software 1121 and application software 1122 as executed on one or more hardware environments 1110. In one embodiment, the methods and processes disclosed here may be implemented as system software 1121, application software 1122, or a combination thereof. System software 1121 may comprise control programs, such as an operating system (OS) or an information management system, that instruct one or more processors 1101 (e.g., microcontrollers) in the hardware environment 1110 on how to function and process information. Application software 1122 may comprise but is not limited to program code, data structures, firmware, resident software, microcode or any other form of information or routine that may be read, analyzed or executed by a processor 1101.

In other words, application software 1122 may be implemented as program code embedded in a computer program product in form of a computer-usable or computer readable storage medium that provides program code for use by, or in connection with, a computer or any instruction execution system. Moreover, application software 1122 may comprise one or more computer programs that are executed on top of system software 1121 after being loaded from storage media 1106 into local memory 1102. In a client-server architecture, application software 1122 may comprise client software and server software. For example, in one embodiment, client software may be executed on a client computing system that is distinct and separable from a server computing system on which server software is executed.

Software environment 1120 may also comprise browser software 1126 for accessing data available over local or remote computing networks. Further, software environment 1120 may comprise a user interface 1124 (e.g., a graphical user interface (GUI)) for receiving user commands and data. It is worthy to repeat that the hardware and software architectures and environments described above are for purposes of example. As such, one or more embodiments may be implemented over any type of system architecture, functional or logical platform or processing environment.

It should also be understood that the logic code, programs, modules, processes, methods and the order in which the respective processes of each method are performed are purely exemplary. Depending on implementation, the processes or any underlying sub-processes and methods may be performed in any order or concurrently, unless indicated otherwise in the present disclosure. Further, unless stated otherwise with specificity, the definition of logic code within the context of this disclosure is not related or limited to any particular programming language, and may comprise one or more modules that may be executed on one or more processors in distributed, non-distributed, single or multiprocessing environments.

As will be appreciated by one skilled in the art, a software embodiment may include firmware, resident software, microcode, etc. Certain components including software or hardware or combining software and hardware aspects may generally be referred to herein as a "circuit," "module" or "system." Furthermore, the subject matter disclosed may be implemented as a computer program product embodied in one or more computer readable storage medium(s) having computer readable program code embodied thereon. Any combination of one or more computer readable storage medium(s) may be utilized. The computer readable storage medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable storage medium may be transmitted using any appropriate medium, including but not limited to wireless, wireline, optical fiber cable, RF, etc., or any suitable combination of the foregoing. Computer program code for carrying out the disclosed operations may be written in any combination of one or more programming languages, including an object oriented programming language such as Java, Smalltalk, C++ or the like and conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Certain embodiments are disclosed with reference to flowchart illustrations and/or block diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The claimed subject matter has been provided here with reference to one or more features or embodiments. Those skilled in the art will recognize and appreciate that, despite of the detailed nature of the exemplary embodiments provided here, changes and modifications may be applied to said embodiments without limiting or departing from the generally intended scope. These and various other adaptations and combinations of the embodiments provided here are within the scope of the disclosed subject matter as defined by the claims and their full set of equivalents.

What is claimed is:

1. A method executable on one or more processors for modeling a test space, the method comprising:
    defining a Cartesian-product model, wherein the Cartesian-product model includes one or more variables, wherein respective values for the variables are assigned to define a test space for a system under test, and restrictions based on which valid variable value combinations are determined for the purpose of testing the Cartesian-product model;
    identifying a first value for a first variable of the one or more variables in coverage requirements of the Cartesian-product model;
    identifying a second value for the first variable of the one or more variables in coverage requirements of the Cartesian-product model;
    determining that the identified first value for the first variable and the identified second value for the first variable are equivalent for the purpose of testing the Cartesian-product model, wherein the first value for the first variable is determined to be equivalent to the second value for the first variable if assigning of either the first value for the first variable or the second value for the first variable to the first variable in the Cartesian-product model results in no change in validity or invalidity status of variable value combinations in the Cartesian-product model; and
    merging the first value for the first variable and the second value for the first variable to create a third value for the first variable, wherein the Cartesian-product model utilizes the third value for the first variable for coverage requirements in exchange for both the first value for the first variable and the second value for the first variable.

2. The method of claim 1 further comprising analyzing the variable value combinations and the restrictions to determine variable values that are deemed equivalent for the purpose of testing the Cartesian-product model.

3. The method of claim 2 wherein the first value for the first variable is deemed equivalent to the second value for the first variable if assigning of either the first value for the first variable or the second value for the first variable to the first variable in the Cartesian-product model yields equal results when utilized to test the Cartesian-product model.

4. The method of claim 1, further comprising:
    receiving input from an independent entity, wherein the input designates candidate variable values for merger.

5. The method of claim 4, further comprising:
    analyzing the Cartesian-product model to determine whether the candidate variable values are equivalent based on the restrictions that apply to variable values in the Cartesian-product model.

6. The method of claim 5, further comprising:
    responsive to determining that the candidate variables are not equivalent, modifying one or more restrictions of the Cartesian-product model to indicate that the candidate variable values are equivalent.

7. The method of claim 6 wherein input from an independent entity is solicited, wherein the input indicates how to modify the restrictions.

8. The method of claim 7 further comprising modifying the Cartesian-product model to merge the candidate variable values according to the provided input.

9. The method of claim 8 wherein the provided input indicates boundary values that indicate the variable values to be merged.

10. A system comprising one or more processors for executing a method for modeling a test space, the system further comprising:
    a logic unit for defining a Cartesian-product model, wherein the Cartesian-product model includes one or more variables, wherein respective values for the variables are assigned to define a test space for a system under test, and restrictions based on which valid variable value combinations are determined for the purpose of testing the Cartesian-product model;
    identifying a first value for a first variable of the one or more variables in coverage requirements of the Cartesian-product model;
    identifying a second value for the first variable of the one or more variables in coverage requirements of the Cartesian-product model;
    determining that the identified first value for the first variable and the identified second value for the first variable are equivalent for the purpose of testing the Cartesian-product model, wherein the first value for the first variable is determined to be equivalent to the second value for the first variable if assigning of either the first value for the first variable or the second value for the first variable to the first variable in the Cartesian-product model results in no change in validity or invalidity status of variable value combinations in the Cartesian-product model; and
    merging the first value for the first variable and the second value for the first variable to create a third value for the first variable, wherein the Cartesian-product model utilizes the third value for the first variable for coverage requirements in exchange for both the first value for the first variable and the second value for the first variable.

11. The system of claim 10 further comprising a logic unit for analyzing the variable value combinations and the restrictions to determine variable values that are deemed equivalent for the purpose of testing the Cartesian-product model.

12. The system of claim 11 wherein the first value for the first variable is deemed equivalent to the second value for the first variable if assigning of either the first value for the first variable or the second value for the first variable to the first variable in the Cartesian-product model yields equal results when utilized to test the Cartesian-product model.

13. The system of claim 10, further comprising:
    receiving input from an independent entity, wherein the input designates candidate variable values for merger.

14. A computer program product comprising program code embedded in a non-transitory data storage medium, wherein execution of the program code on a computer causes the computer to:
    define a Cartesian-product model, wherein the Cartesian-product model includes one or more variables, wherein respective values for the variables are assigned to define a test space for a system under test, and restrictions based on which valid variable value combinations are determined for the purpose of testing the Cartesian-product model;
    identifying a first value for a first variable of the one or more variables in coverage requirements of the Cartesian-product model;
    identifying a second value for the first variable of the one or more variables in coverage requirements of the Cartesian-product model;
    determining that the identified first value for the first variable and the identified second value for the first variable are equivalent for the purpose of testing the Cartesian-product model, wherein the first value for the first variable is determined to be equivalent to the second value for the first variable if assigning of either the first value for the first variable or the second value for the first variable to the first variable in the Cartesian-product model results in no change in validity or invalidity status of variable value combinations in the Cartesian-product model; and
    merging the first variable value for the first variable and the second value for the first variable to create a third value for the first variable, wherein the Cartesian-product model utilizes the third value for the first variable for coverage requirements in exchange for both the first value for the first variable and the second value for the first variable.

15. The computer program product of claim 14 wherein execution of the program code on a computer further causes the computer to analyze the variable value combinations and the restrictions to determine variable values that are deemed equivalent for the purpose of testing the Cartesian-product model.

16. The computer program product of claim 15 wherein the first value for the first variable is deemed equivalent to the second value for the first variable if assigning of either the first value for the first variable or the second value for the first variable to the first variable in the Cartesian-product model yields results when utilized to test the Cartesian-product model.

17. The computer program product of claim 14, further comprising:
    receiving input from an independent entity, wherein the input designates candidate variable values for merger.

18. The method of claim 1, wherein the merging the first value for the first variable and the second value for the first variable to create a third value for the first variable, further comprises:
    providing a suggestion to merge the first value for the first variable and the second value for the first variable to create a third value for the first variable to utilize in coverage requirements of the Cartesian-product model; and
    receiving an indication to merge the first value for the first variable and the second value for the first variable to create a third value for the first variable.

19. The system of claim 10, wherein the merging the first value for the first variable and the second value for the first variable to create a third value for the first variable, further comprises:
    providing a suggestion to merge the first value for the first variable and the second value for the first variable to create a third value for the first variable to utilize in coverage requirements of the Cartesian-product model; and
    receiving an indication to merge the first value for the first variable and the second value for the first variable to create a third value for the first variable.

20. The computer program product of claim 14, wherein the merging the first value for the first variable and the second value for the first variable to create a third value for the first variable, further comprises:
- providing a suggestion to merge the first value for the first variable and the second value for the first variable to create a third value for the first variable to utilize in coverage requirements of the Cartesian-product model; and
- receiving an indication to merge the first value for the first variable and the second value for the first variable to create a third value for the first variable.

* * * * *